United States Patent
Uesaka

(10) Patent No.: US 9,194,919 B2
(45) Date of Patent: Nov. 24, 2015

(54) ELECTRIC STORAGE DEVICE, ELECTRONIC DEVICE, POWER SYSTEM, AND ELECTRIC VEHICLE

(71) Applicant: Sony Corporation, Tokyo (JP)

(72) Inventor: Shinichi Uesaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/364,789

(22) PCT Filed: Oct. 22, 2012

(86) PCT No.: PCT/JP2012/077811
§ 371 (c)(1),
(2) Date: Aug. 6, 2014

(87) PCT Pub. No.: WO2013/094311
PCT Pub. Date: Jun. 27, 2013

(65) Prior Publication Data
US 2014/0379188 A1    Dec. 25, 2014

(30) Foreign Application Priority Data

Dec. 22, 2011  (JP) ................. 2011-280700

(51) Int. Cl.
| | |
|---|---|
| *B60L 9/00* | (2006.01) |
| *G01R 31/36* | (2006.01) |
| *H01M 10/44* | (2006.01) |
| *H01M 10/48* | (2006.01) |
| *H02J 7/00* | (2006.01) |
| *B60L 3/00* | (2006.01) |

(Continued)

(52) U.S. Cl.
CPC ........... *G01R 31/3662* (2013.01); *B60L 3/0046* (2013.01); *B60L 11/18* (2013.01); *G01R 31/3606* (2013.01); *G01R 31/3658* (2013.01); *H01M 10/4207* (2013.01); *H01M 10/44* (2013.01); *H01M 10/48* (2013.01); *H02J 7/00* (2013.01); *H02J 7/007* (2013.01); *B60L 11/187* (2013.01); *G01R 31/3624* (2013.01); *H01M 2220/20* (2013.01); *Y02T 10/7005* (2013.01); *Y02T 10/705* (2013.01); *Y02T 10/7011* (2013.01)

(58) Field of Classification Search
None
See application file for complete search history.

(56) References Cited

U.S. PATENT DOCUMENTS

| | | | |
|---|---|---|---|
| 5,598,087 A | 1/1997 | Hara | |
| 2007/0216407 A1* | 9/2007 | Yamaguchi | ................ 324/256 |

(Continued)

FOREIGN PATENT DOCUMENTS

| | | |
|---|---|---|
| EP | 2498365 A1 | 9/2012 |
| JP | 07-055903 A | 3/1995 |

(Continued)

*Primary Examiner* — Adam Alharbi
(74) *Attorney, Agent, or Firm* — K&L Gates LLP

(57) ABSTRACT

An electric storage device includes an electric storage unit that includes one or a plurality of electric storage elements, a measurement unit that measures voltage, a current, and a temperature of the electric storage element, and a calculation unit that calculates internal resistance of the electric storage element based on the voltage, the current, and the temperature measured by the measurement unit. When a determination unit detects discontinuity of temporal variation of the calculated internal resistance, it is determined that the electric storage element has been exchanged. Since the electric storage element such as a lithium ion secondary battery has such a characteristic that the internal resistance increases as the number of use is increased, the exchange of batteries can be detected from the change in the internal resistance.

12 Claims, 9 Drawing Sheets

(51) Int. Cl.
  *H01M 10/42* (2006.01)
  *B60L 11/18* (2006.01)

(56) References Cited

U.S. PATENT DOCUMENTS

| | | | |
|---|---|---|---|
| 2009/0075160 A1* | 3/2009 | Tezuka et al. | 429/62 |
| 2011/0299564 A1* | 12/2011 | Leutheuser et al. | 374/134 |
| 2013/0113432 A1* | 5/2013 | Suzuki et al. | 320/134 |
| 2013/0200902 A1* | 8/2013 | Kurimoto | 324/430 |
| 2014/0091739 A1* | 4/2014 | Sato et al. | 318/139 |

FOREIGN PATENT DOCUMENTS

| | | |
|---|---|---|
| JP | 3104747 U | 10/2004 |
| JP | 2007-265975 A | 10/2007 |
| JP | 2008-008703 A | 1/2008 |
| JP | 2008-065989 A | 3/2008 |
| JP | 2009-133675 A | 6/2009 |
| JP | 2009-151953 A | 7/2009 |
| JP | 2011-101532 A | 5/2011 |

* cited by examiner

FIG. 3

| SEQUENCE | INTERNAL RESISTANCE | TEMPERATURE | CORRECTED VALUE | REPRESEN-TATIVE VALUE |
|---|---|---|---|---|
| 1 | r0 | T0 | r0' | R0 |
| 2 | r1 | T1 | r1' | |
| 3 | r2 | T2 | r2' | |
| 4 | r3 | T3 | r3' | R3 |
| 5 | r4 | T4 | r4' | |
| 6 | r5 | T5 | r5' | |
| 7 | r6 | T6 | r6' | R6 |
| 8 | r7 | T7 | r7' | |
| 9 | r8 | T8 | r8' | |
| 10 | r9 | T9 | r9' | R9 |
| 11 | r10 | T10 | r10' | |
| 12 | r11 | T11 | r11' | |

FIG. 6
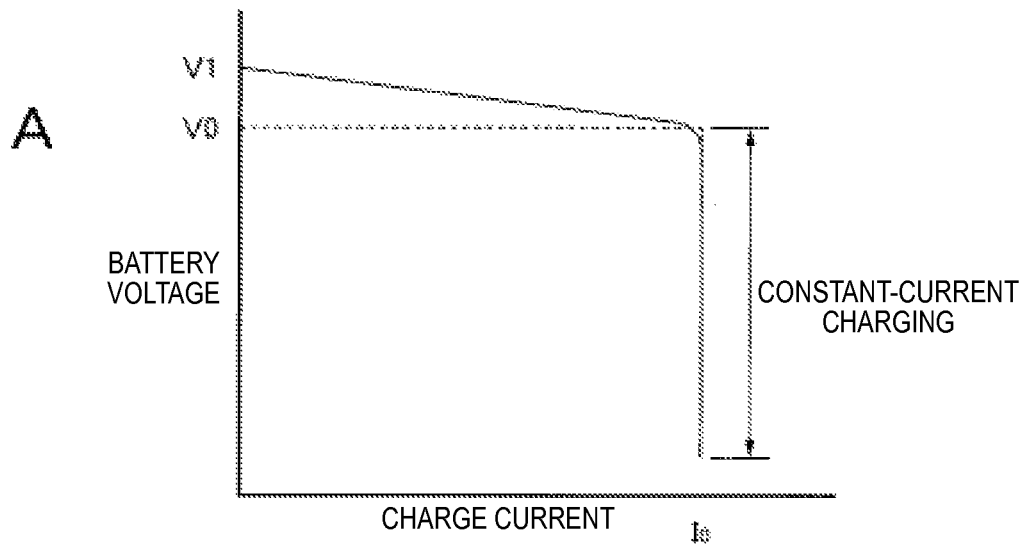
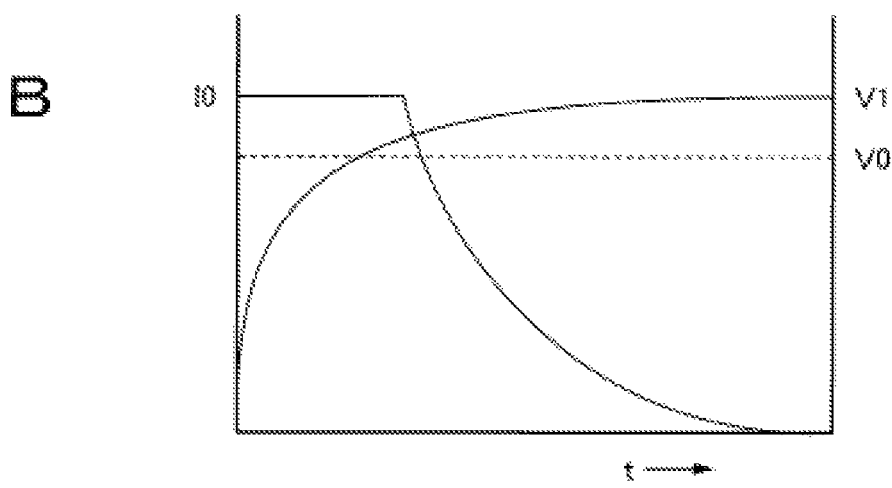

ELECTRIC STORAGE DEVICE, ELECTRONIC DEVICE, POWER SYSTEM, AND ELECTRIC VEHICLE

CROSS REFERENCES TO RELATED APPLICATIONS

The present application is a national stage of International Application No. PCT/JP2012/077811 filed on Oct. 22, 2012 and claims priority to Japanese Patent Application No. 2011-280700 filed on Dec. 22, 2011, the disclosure of which is incorporated herein by reference.

BACKGROUND

The present disclosure relates to an electric storage device constituted by secondary batteries, for example, and an electronic device, a power system, and an electric vehicle that use the electric storage device.

The electric storage device including batteries such as lithium ion secondary batteries is widely used as a mobile electronic device, an electric vehicle, a backup power source, etc. Regarding the electric storage device, there are problems that imitations by parties other than regular manufacturers are distributed or illegal modification is performed. It is possible that such imitations or illegally modified products (hereinafter, generally referred to as irregular products) use an inferior batter element, or have defects in protection circuit parts or a circuit. As a result, the irregular products often have a problem in terms of safety as compared with regular battery packs. Therefore, as described in Patent Literature 1, it is proposed that an IC (Integrated Circuit) for authentication is mounted on each of the electric storage device and the electronic device and, only when mutual authentication is established, the electric storage device is determined to be regular and used.

In the conventional method of determining whether the electric storage device is regular by authentication, it is necessary to mount an IC for authentication on both the electric storage device and the electronic device and provide a terminal for communication to both of them, and there is a problem of causing increase in cost. Moreover, there is a problem that modified products in which an IC for authentication is reused cannot be detected.

Furthermore, the following Patent Literature 2 describes that the internal resistance of battery cells of a battery pack is measured and it is determined, when the internal resistance is smaller than previous internal resistance, that the battery cell has been exchanged. That is, in the case of a lithium ion secondary cell, the internal resistance is normally increased as a use period passes, and thus it is determined that a battery cell has been exchanged when the internal resistance is decreased.

CITATION LIST

Patent Literature

Patent Literature 1: JP 2009-151953A
Patent Literature 2: JP 2008-65989A

SUMMARY

Technical Problem

The conventional Patent Literature 2 also describes that the variation of a temperature of a battery cell is detected. However, there was a problem that the temperature conditions are not considered with respect to internal resistance.

Therefore, the present disclosure aims at providing an electric storage device capable of solving problems in the case when the above-described authentication ID is mounted and enabling accurate determination while considering a temperature, an electronic device, a power system, and an electric vehicle.

Solution to Problem

According to the present disclosure, there is provided an electric storage device including an electric storage unit that includes one or a plurality of electric storage elements, a measurement unit that measures voltage, a current, and a temperature of the electric storage element, a calculation unit that calculates internal resistance of the electric storage element based on the voltage, the current, and the temperature measured by the measurement unit, and a determination unit that determines, when discontinuity of temporal variation of the internal resistance is detected, that the electric storage element has been exchanged.

According to the present disclosure, there is provided a power system, in which the electric storage device is charged by a power generation device that generates power from renewable energy.

According to the present disclosure, there is provided an electric vehicle including a conversion device that receives supply of power from the electric storage device according to claim 1 and converts the power into driving power of the vehicle; and a control device that performs information processing regarding vehicle control based on information about the electric storage device.

According to the present disclosure, there is provided a power system including a power information transmission and reception unit that performs transmission and reception of signals with another device through a network. Charge and discharge control of the electric storage device according to claim 1 is performed based on information received by the power information transmission and reception unit.

According to the present disclosure, there is provided a power system that receives supply of power from the electric storage device and supplies power to the electric storage device from a power generation device or a power network.

Advantageous Effects of Invention

According to the embodiments, a temperature of an electric storage element is measured, and the internal resistance of the electric storage element is calculated based on voltage, a current, and the temperature. Thus, the temperature is considered, which enables accurate determination.

Additional features and advantages are described herein, and will be apparent from the following Detailed Description and the figures.

BRIEF DESCRIPTION OF THE FIGURES

FIG. 3 is a schematic diagrammatic view used for explanation of the first embodiment.

FIG. 6A and FIG. 6B are schematic diagrammatic views used for explanation of the second embodiment.

DETAILED DESCRIPTION

Hereinafter, embodiments will be described. The description will be made in the following order.
<1. First Embodiment>
<2. Second Embodiment>
<3. Application Example>
<4. Modification Example>

Note that the embodiments described in the following are preferred embodiments, and although various kinds of technically preferable limitation are applied, the scope of the invention is not limited to these embodiments unless it is particularly stated, in the following description, that the invention is limited.

<1. First Embodiment>

Figure 1:
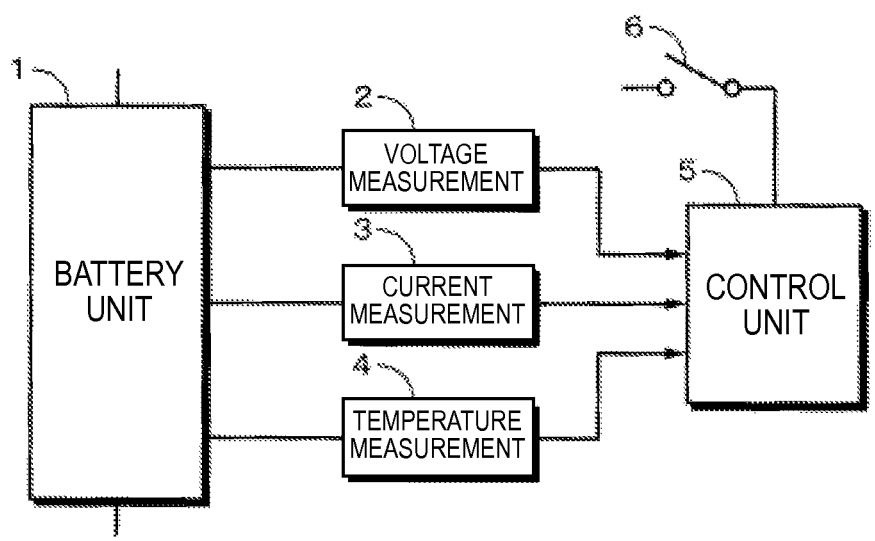
FIG. 1 is a block diagram of a first embodiment of an electric storage device of the present disclosure.

The first embodiment of the present disclosure is arranged by applying the present disclosure to an electric storage device mounted on an electric vehicle such as a vehicle that can travel (EV travel) a certain distance as an electric car after secondary batteries are charged with a domestic power source, such as an EV (Electric Vehicle): electric car, and a PHEV (Plug-in Hybrid Electric Vehicle): hybrid car. As illustrated in FIG. 1, a vehicle driving battery unit 1 is provided. The battery unit 1 is constituted by a plurality of lithium ion secondary batteries connected in series, for example. A plurality of battery cells may be connected in parallel, and the parallel connection may be changed to serial connection.

Voltage of each battery cell of the battery unit 1 is measured by a voltage measurement unit 2. A current flowing in the battery unit 1 is measured by a current measurement unit 3. Moreover, a temperature of the battery unit 1 is measured by a temperature measurement unit 4. The information on the voltage, the current, and the temperature that are measured by the measurement units 2, 3, and 4 is converted into digital signals by an A/D converter (not illustrated) and supplied to a control unit 5. Signals in accordance with ON/OFF of an engine starting switch 6 are supplied to the control unit 5.

The control unit 5 is a microcomputer constituted by a CPU (Central Processing Unit), etc., for example. The control unit 5 includes a ROM (Read Only Memory), a RAM (Random Access Memory), etc. The control unit 5 executes programs stored in the ROM, thereby integrally controlling each unit of the electric storage device.

Figure 2:
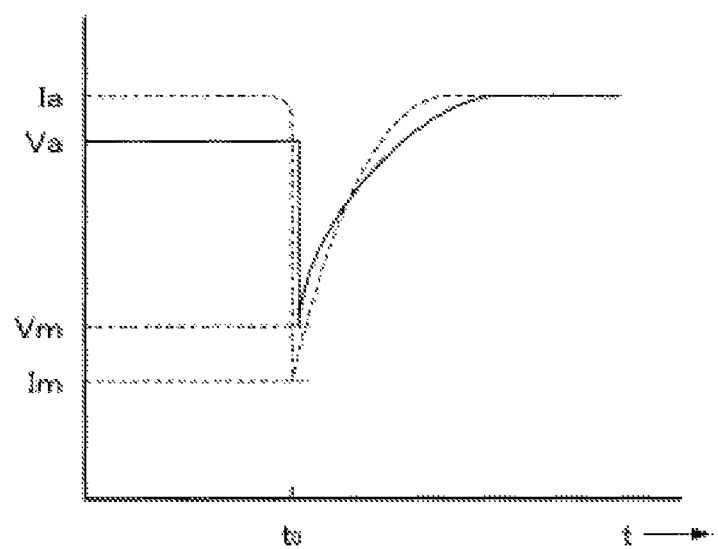
FIG. 2 is a schematic diagrammatic view used for explanation of the first embodiment.

In the case of an electric vehicle, the load is a motor. Thus, a large current and voltage flows instantaneously when started. As illustrated schematically in FIG. 2, when the starting switch 6 is turned on at time t0, the decrease of voltage (decrease from Va to Vm, as illustrated with a solid line) and the decrease of a current (decrease from Ia to Im, as illustrated with a broken line) occur instantaneously immediately after t0. Then, the voltage and the current are gradually enhanced during a starting period of t0 intention. The starting switch 6 is turned on not only by starting operation but also in the case when an engine is automatically started from an idling stop state.

The decrease of voltage $\Delta V$ (=Va−Vm) is measured by the voltage measurement unit 2, and the decrease of a current $\Delta I$(=Ia−Im) is measured by the current measurement unit 3. The decrease of voltage of each of a plurality of battery cells of the battery unit 1 is measured. Then, the internal resistance $r(r=\Delta V/\Delta I)$ is calculated by the control unit 5. Moreover, the control unit 5 performs temperature correction regarding the internal resistance r with the use of temperature data from the temperature measurement unit 4. The internal resistance r' after temperature correction is stored in a memory of the control unit 5. The memory is preferably a nonvolatile memory.

As illustrated in FIG. 3, data is stored in the memory of the control unit 5. In FIG. 3, the sequence indicates the number of times of engine start. In the first engine start, the internal resistance r0 is calculated by the control unit 5 based on the measured voltage and current. Moreover, the control unit 6 calculates internal resistance r0' after temperature correction with the use of temperature data T0 of the measured temperature. At least the temperature data T0 and the internal resistance r0' after correction are stored in the memory.

Subsequently, the same processing is performed, and the internal resistance after temperature correction r1', r2', r3', . . . . is acquired every time the engine is started. As an example, when three pieces of data of internal resistance are obtained, the control unit 5 calculates their representative value R0 and stores it in the memory. As the representative value, an average value, a standard deviation, an intermediate value, etc. can be used. It is possible to reduce influence of measurement errors, etc. by generating a representative value. The number of internal resistance for generating a representative value may be the number other than three.

Figure 4:
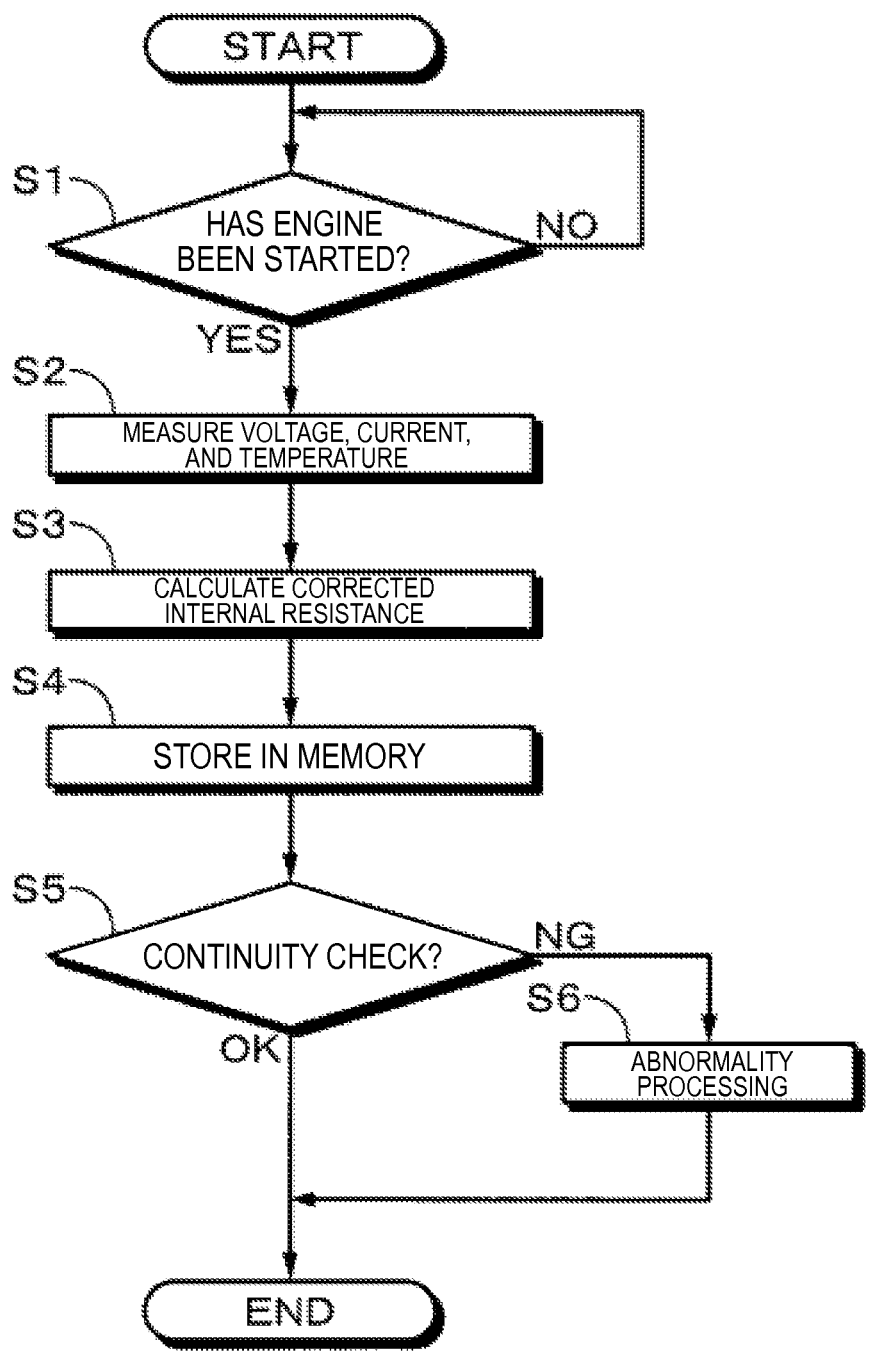
FIG. 4 is a flowchart illustrating processing of the first embodiment.

A flow of the processing of the first embodiment performed by the control of the control unit 5 will be described with reference to FIG. 4. Whether the engine starting switch 6 has been turned on is determined at Step S1. When it is determined that the engine starting switch 6 has been turned on, voltage, a current, and a temperature when started are measured at Step S2.

The internal resistance after temperature correction is calculated using such measurement results, at Step S3. Moreover, as described above, a representative value is calculated based on a plurality of internal resistance, and the representative value is stored in the memory (Step S4).

The continuity is checked at Step S5. A current representative value is subtracted from a previous representative value to calculate a difference, and the continuity is checked based on the difference. For example, when a varying direction of the difference is an increasing direction, it is determined that there is continuity. On the other hand, when a varying direction of the difference is a decreasing direction, it is determined that there is no continuity.

In the case of the lithium ion secondary battery, generally, the internal resistance increases as the number of use is increased. Thus, it can be determined that it is highly possible that the internal resistance is decreased or one or a plurality of battery cells have been exchanged in the battery unit 1. Moreover, even when the number of use is increased slightly, a variation width of internal resistance is not significantly large. Therefore, when the internal resistance is varied extremely, it may be determined that there is no continuity.

When the result of the continuity check is NG (that is, when the internal resistance is decreased) at Step S5, the processing for the time of abnormality is performed at Step S6. For example, notification indicating that it is highly possible that a battery cell has been exchanged is made to a user by display on a display and/or audio. Moreover, when the NG as the check result is continued a given number of times, the use of the battery unit may be stopped. Note that the exchange of a battery cell here is irregular exchange, and does not indicate regular exchange by manufacturers, etc. Thus, when regular exchange of a battery cell is performed, the stored internal resistance or representative values are reset, and the processing is started from the initial state.

<2. Second Embodiment>

Figure 5:
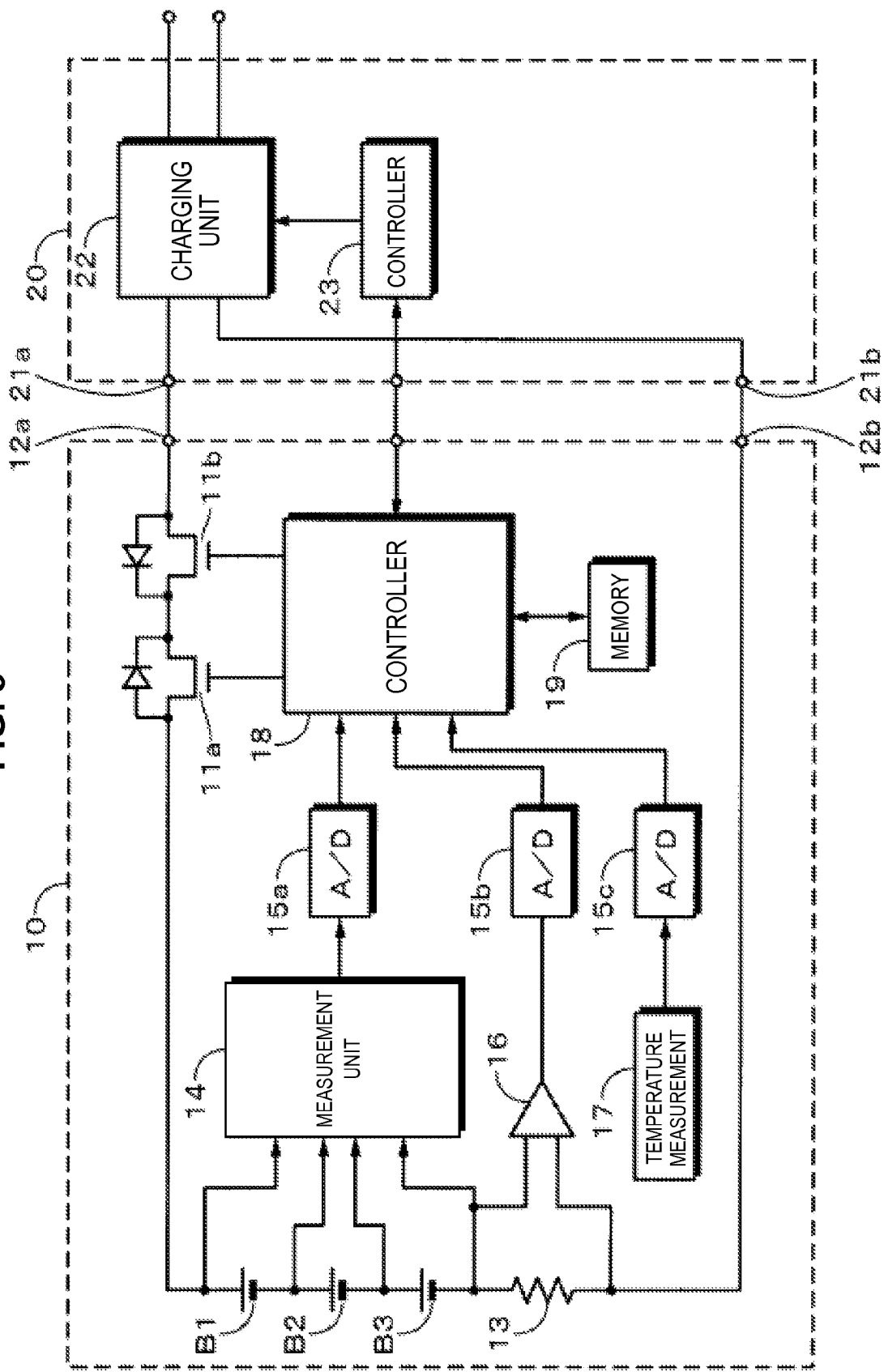
FIG. 5 is a block diagram of a second embodiment of the electric storage device of the present disclosure.

FIG. 5 is a block diagram illustrating an example of a circuit configuration of an electric storage device in a second embodiment of the present disclosure. An electric storage device 10 illustrated surrounded by a broken line has battery cells B1, B2, and B3 such as lithium ion secondary batteries. The serial connection of the three battery cells B1, B2, and B3 is of an example, and a battery unit is constituted by one or a plurality of battery cells connected in series or in parallel. For example, six battery cells may be connected in two parallel three series (2P3S).

The positive electrode side of the battery cells B1, B2, and B3 is connected to a positive electrode terminal 12a through charge control FET (Field Effect Transistor) 11a and a discharge control FET 11b, while the negative electrode side thereof is connected to a negative electrode terminal 12b through a current detection resistor 13. At the time of charging, these terminals 12a and 12b are connected to a positive electrode terminal 21a and a negative electrode terminal 21b of a charging device 20, respectively. The positive electrode terminal 21a and the negative electrode terminal 21b are derived from a charging unit 22. An AC power source from a commercial power source, for example, is supplied to the charging unit 22 and converted into a DC power source by the charging unit 22.

Voltage of each of the battery cells B1, B2, and B3 is measured by a measurement unit 14, and converted into digital signals by an A/D converter 15a. Then, voltage data of the digital signals is supplied to a controller 18. The both ends of the current detection resistor 13 are supplied to an amplifier 16, and the output of the amplifier 16 is supplied to an A/D converter 15b. Current data of digital signals corresponding to a current value is obtained from the A/D converter 15b, and the current data is supplied to the controller 18. Moreover, a temperature measurement unit 17 including a temperature detecting element such as a thermistor is provided. The temperature measurement unit 17 detects a temperature of each battery cell. Signals corresponding to the temperature output from the temperature measurement unit 17 are supplied to an A/D converter 15c, and converted into temperature data of digital signals. The temperature data is supplied to the controller 18.

The controller 18 is a microcomputer constituted by a CPU (Central Processing Unit), a ROM (Read Only Memory), a RAM (Random Access Memory), etc. A nonvolatile memory 19 is connected to the controller 18. The memory 119 is an EPROM (Erasable Programmable Read Only Memory) or an EEPROM (Electrically Erasable and Programmable Read Only Memory), for example.

When it is detected, in the above-described electric storage device 10, that the battery voltage has become overcharge detection voltage, the controller 18 turns off the charge control FET 11a to control such that a charge current does not flow on current paths of the battery cells B1 to B3. After the FET 11a is turned off, only discharge is possible through diodes. Moreover, when a large current flows at the time of charging, the controller 18 turns off the FET 11a to control such that a charge current flowing on current paths of the batteries is shut off.

The discharge control FET 11b is turned off when the battery voltage has become overdischarge detection voltage, and the controller 18 controls such that a discharge current does not flow on current paths of the battery cells B1 to B3. After the FET 11b is turned off, only charge is possible through diodes. Moreover, when a large current flows at the time of discharging, the controller 18 turns off the FET 11b to control such that a discharge current flowing on the current paths of the battery cells B1 to B3 is shut off. Furthermore, the controller 18 performs charge and discharge control using temperature information at the time of abnormal heating, and performs correction in calculation of remaining capacity.

The controller 18 of the electric storage device 10 and the controller 23 of the charging device 20 are connected. Various kinds of information are transmitted from the electric storage device 20 to a DC device 10 through communication between these controllers. The controller 18 and the controller 23 charge the battery cells B1 to B3 by a constant-current and constant-voltage charging system.

FIG. 6A and FIG. 6B schematically illustrate the constant-current and constant-voltage charging system, and constant-current charging is performed using a current of a given value of I0 from the time of the start of charging. When the battery voltage becomes given voltage V0, the constant-current charging is switched to constant-voltage charging. Then, when the current becomes nearly 0, it is determined that the charging is completed, and the charging is stopped. The battery voltage in this case is V1.

The controller 18 of the electric storage device 10 calculates, at the time of charging, internal resistance of each of the battery cells B1 to B3 based on voltage data and current data, and further calculates internal resistance after temperature correction based on temperature data. A representative value is found based on the calculated internal resistance after correction, and the measurement data, the internal resistance after correction, and the representative value are stored in the memory 19. The internal resistance of each of the battery cells B1 to B3 can be calculated when voltage and a current vary comparatively largely. That is, the internal resistance is calculated based on the variation of voltage and a current immediately after the charging is started.

Figure 7:
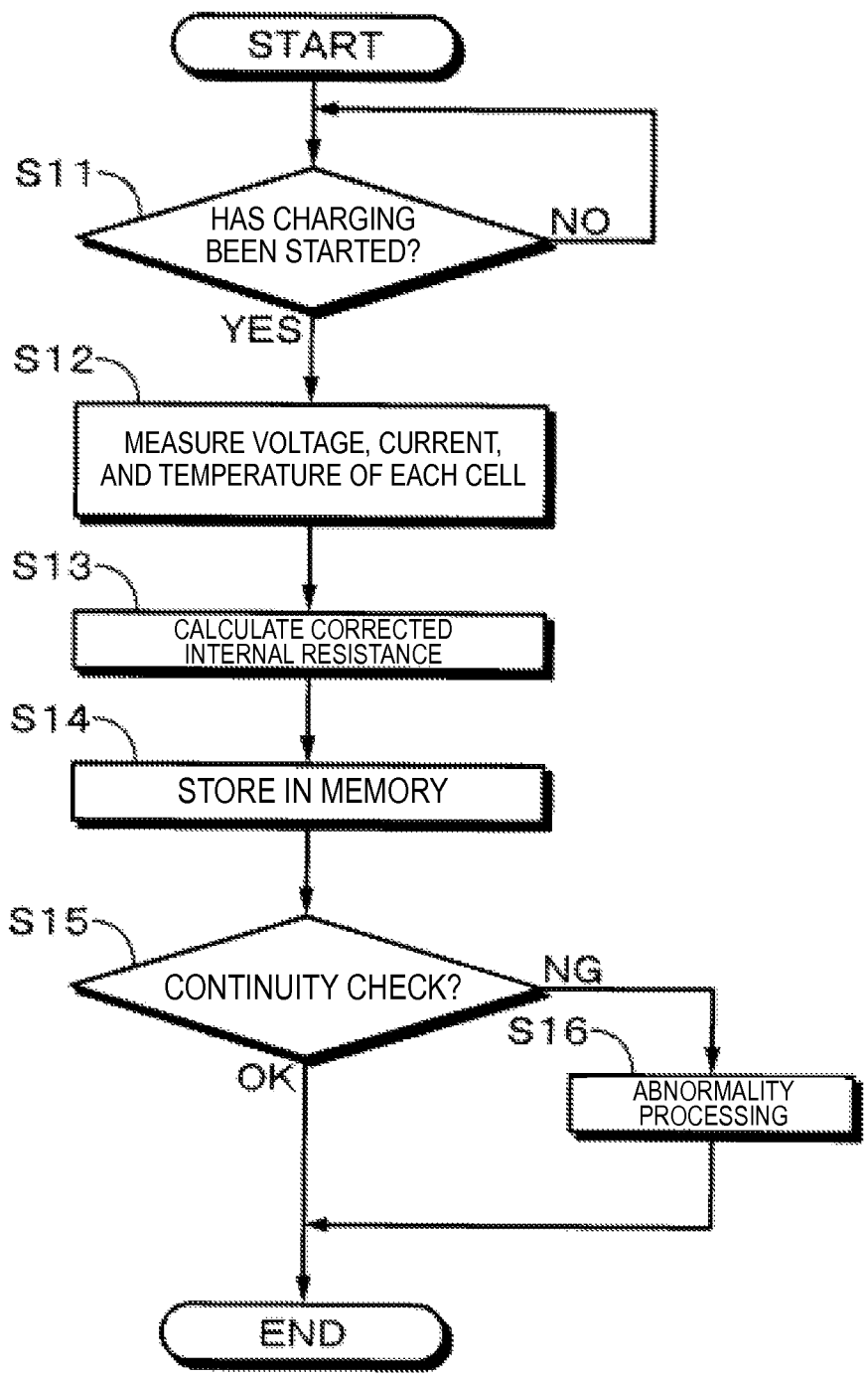
FIG. 7 is a flowchart illustrating processing of the second embodiment.

A flow of processing of the second embodiment performed by the control of the controller 18 will be described with reference to FIG. 7. Whether the charging has been started is determined at Step S11. When it is determined that the charging has been started by notification from the controller 23, for example, the variation of voltage, the variation of a current, and a temperature during a given period of time from the start of charging are measured at Step S12.

The internal resistance after temperature correction is calculated using such measurement results, at Step S13. Moreover, similarly to the above-described first embodiment, a representative value is calculated based on a plurality of internal resistance, and the representative value is stored in the memory (Step S14).

The continuity is checked at Step S15. A current representative value is subtracted from a previous representative value to calculate a difference, and the continuity is checked based on the difference. For example, when a varying direction of the difference is an increasing direction, it is determined that there is continuity. On the other hand, when a varying direction of the difference is a decreasing direction, it is determined that there is no continuity.

In the case of the lithium ion secondary battery, generally, the internal resistance increases as the number of use is increased. Therefore, when the internal resistance has decreased, it can be determined that it is highly possible that one or a plurality of battery cells have been exchanged in the battery unit 1. Moreover, even when the number of use is increased slightly, a variation width of internal resistance is not significantly large. Therefore, when the internal resistance is varied extremely, it may be determined that there is no continuity.

When the result of the continuity check is NG (that is, when the internal resistance is decreased) at Step S15, the processing for the time of abnormality is performed at Step S16. For example, notification indicating that it is highly possible that a battery cell has been exchanged is made to a user by display on a display and/or audio. Furthermore, the occurrence of abnormality may be notified to the controller 23 of the charging device 20 to stop charging. Note that the exchange of a battery cell here is irregular exchange, and does not indicate regular exchange by manufacturers, etc. Thus, when regular exchange of a battery cell is performed, the stored internal resistance or representative values are reset, and the processing is started from the initial state.

The present disclosure can also adopt the following configuration.

(1)

An electric storage device including:

an electric storage unit that includes one or a plurality of electric storage elements;

a measurement unit that measures voltage, a current, and a temperature of the electric storage element;

a calculation unit that calculates internal resistance of the electric storage element based on the voltage, the current, and the temperature measured by the measurement unit; and a determination unit that determines, when discontinuity of temporal variation of the internal resistance is detected, that the electric storage element has been exchanged.

(2)

The electric storage device according to (1), wherein the electric storage unit is used for a vehicle, and the internal resistance is calculated when an engine is started.

(3)

The electric storage device according to (1), wherein the internal resistance is calculated when charging of the electric storage unit is started.

(4)

The electric storage device according to any one of (1) and (2), wherein stored first internal resistance is compared with second internal resistance calculated based on measured voltage, current, and temperature, and discontinuity is detected when the second internal resistance is decreased as compared with the first internal resistance.

(5)

The electric storage device according to (4), wherein the first internal resistance and second internal resistance are of values after temperature correction.

(6)

The electric storage device according to (4), wherein the first internal resistance and second internal resistance that are obtained when temperatures are substantially equal are compared.

(7)

The electric storage device according to (1), wherein a plurality of values of the first internal resistance and second internal resistance are converted into representative values, and comparison is performed using the representative values.

(8)

A power system, wherein the electric storage device according to (1) is charged by a power generation device that generates power from renewable energy.

(9)

An electric vehicle including:

a conversion device that receives supply of power from the electric storage device according to (1) and converts the power into driving power of the vehicle; and a control device that performs information processing regarding vehicle control based on information about the electric storage device.

(10)

A power system including:

a power information transmission and reception unit that performs transmission and reception of signals with another device through a network, wherein charge and discharge control of the electric storage device according to (1) is performed based on information received by the power information transmission and reception unit.

(11)

A power system that receives supply of power from the electric storage device according to (1) and supplies power to the electric storage device from a power generation device or a power network.

<3. Application Example>

"Electric Storage System in House as Application Example"

Figure 8:
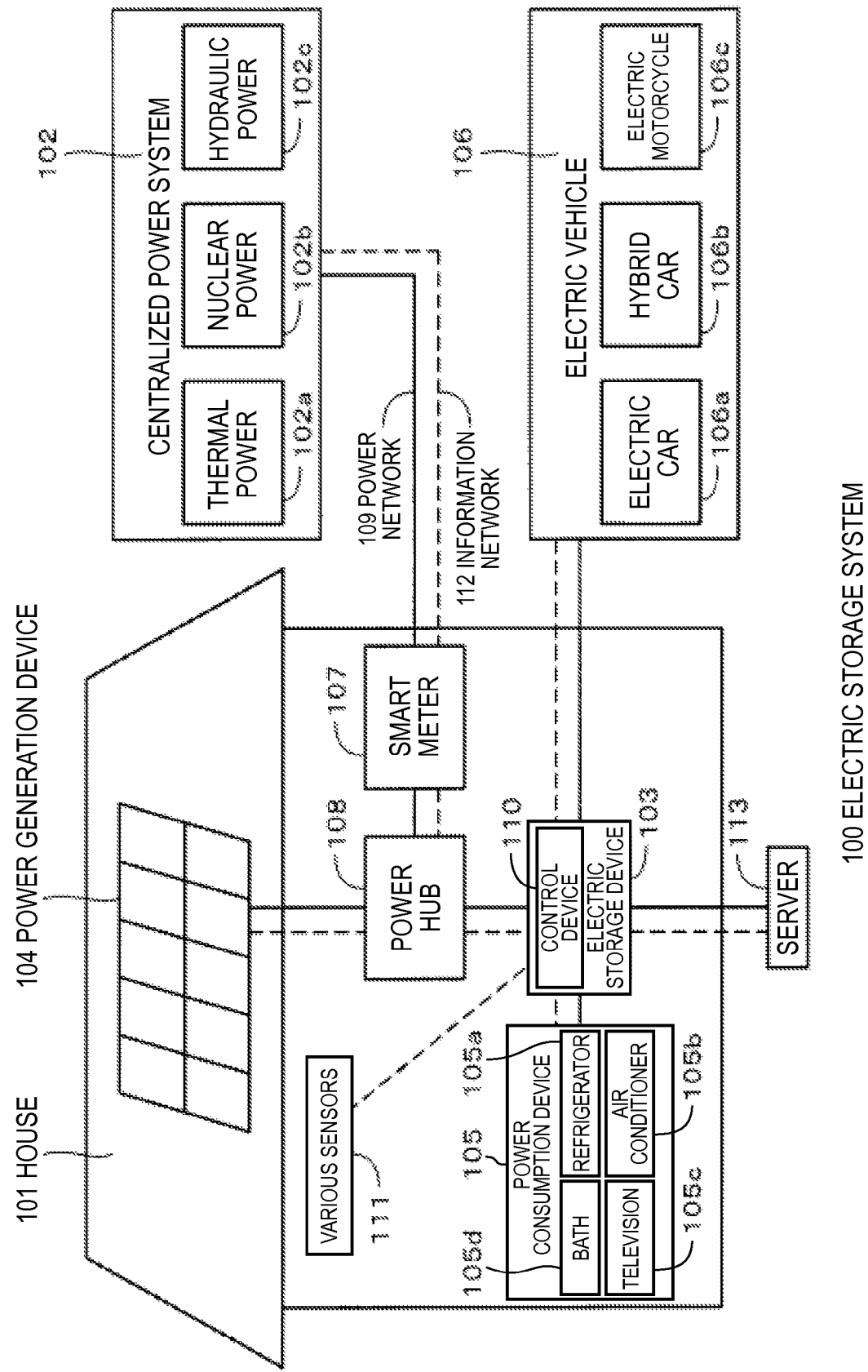
FIG. 8 is a block diagram for explaining an application example of the electric storage device.

An example in which the present disclosure is applied to the electric storage system for houses will be described with reference to FIG. 8. For example, in an electric storage system 100 for a house 101, power is supplied to an electric storage device 103 from a centralized power system 102 such as thermal power 102*a*, nuclear power 102*b*, and hydraulic power 102*c* through a power network 109, an information network 112, a smart meter 107, a power hub 108, etc. Together with this, power is supplied to the electric storage device 103 from an independent power source such as a domestic power generation device 104. The power supplied to the electric storage device 103 is stored. The power used in the house 101 is supplied using the electric storage device 103. The same electric storage system can be used not only in the house 101 but also in buildings.

The house 101 is provided with the power generation device 104, a power consumption device 105, the electric storage device 103, a control device 110 controlling each device, the smart meter 107, and sensors 111 acquiring various kinds of information. The devices are connected through the power network 109 and the information network 112. A solar cell, a fuel cell, etc. are used as the power generation device 104, and generated power is supplied to the power consumption device 105 and/or the electric storage device 103. The power consumption device 105 is a refrigerator 105*a*, an air conditioner 105*b*, a television receiver 105*c*, a bath 105*d*, etc. Moreover, the power consumption device 105 includes an electric vehicle 106. The electric vehicle 106 is an electric car 106*a*, a hybrid car 106*b*, and an electric motorcycle 106*c*.

The electric storage device of the present disclosure described above is applied to the electric storage device 103. The electric storage device 103 is constituted by secondary batteries or a capacitor. For example, the electric storage device 103 is constituted by lithium ion batteries. The lithium ion battery may be a stationary type or may be one used in the electric vehicle 106. The smart meter 107 has a function of measuring a use amount of commercial power and transmitting the measured use amount to an electric power company. The power network 109 may be of one of DC power supply, AC power supply, and noncontact power supply or of the combination of a plurality of them.

The various sensors 111 are a human sensor, an illumination sensor, an object detection sensor, a power consumption sensor, a vibration sensor, a contact sensor, a temperature sensor, an infrared sensor, etc., for example. The information acquired by the various sensors 111 is transmitted to the control device 110. Weather conditions, human conditions, etc. are grasped based on the information from the sensors 111, and it is possible to automatically control the electric consumption device 105 so that energy consumption is minimum. Moreover, the control device 110 can transmit information about the house 101 to an external electric power company, etc. through an internet.

The power hub 108 performs processing of branch of a power line, DC-AC conversion, etc. As a communication system of the information network 112 connected to the control device 110, there are a method of using a communication interface such as a UART (Universal Asynchronous Receiver-Transceiver: transmission and reception circuit for asynchronous serial communication) and a method of using a sensor network by a wireless communication standard such as Bluetooth, ZigBee, and Wi-Fi. The Bluetooth system is applied to multimedia communication, and the communication of one-to-many connection is possible. The ZigBee uses a physical layer of IEEE (Institute of Electrical and Electronics Engineers) 802.15.4. The IEEE802.15.4 is a name of a short distance wireless network standard referred to as PAN (Personal Area Network) or W (Wireless) PAN.

The control device 110 is connected to an external server 113. The server 113 may be managed by any of the house 101, an electric power company, and a service provider. The information transmitted and received by the server 113 is power consumption information, life pattern information, power rates, weather information, natural disaster information, and information about power transaction, for example. Such information may be transmitted and received by a domestic electric consumption device (a television receiver, for example), and may be transmitted and received by a device outside home (a cellular phone, etc., for example). Such information may be displayed on a device having a display function, e.g. a television receiver, a cellular phone, PDA (Personal Digital Assistants), etc.

The control device 110 controlling each unit is constituted by a CPU (Central Processing Unit), a RAM (Random Access Memory), a ROM (Read Only Memory), etc., and stored in the electric storage device 103 in this example. The control device 110 is connected to the electric storage device 103, the domestic power generation device 104, the power consumption device 105, the various sensors 111, and the server 113 through the information network 112, and has a function of adjusting a use amount of commercial power and a power generation amount. In addition, the control device 110 may have a function of performing power transaction in the power market, etc.

As illustrated above, not only power from the centralized power system 102 such as the thermal power 102a, the nuclear power 102b, and the hydraulic power 102c but also power generated by the domestic power generation device 104 (solar power generation, wind power generation) can be stored in the electric storage device 103. Therefore, even when power generated by the domestic power generation device 104 is varied, it is possible to perform control of keeping electric energy transmitted to the outside constant or discharging only a required amount. For example, it is also possible to adopt a use in which power obtained by solar power generation is stored in the electric storage device 103 and, at the same time, midnight power that is cheaper in cost during night is stored in the electric storage device 103 so that the power stored by the electric storage device 103 is discharged and used in the daytime period when the cost is high.

Note that although this example describes the case in which the control device 110 is stored in the electric storage device 103, the control device 110 may be stored in the smart meter 107 or may be constituted individually. Moreover, the electric storage system 100 may be used for a plurality of households in an apartment house, or may be used for a plurality of detached houses.

"Electric Storage System in Vehicle as Application Example"

Figure 9:
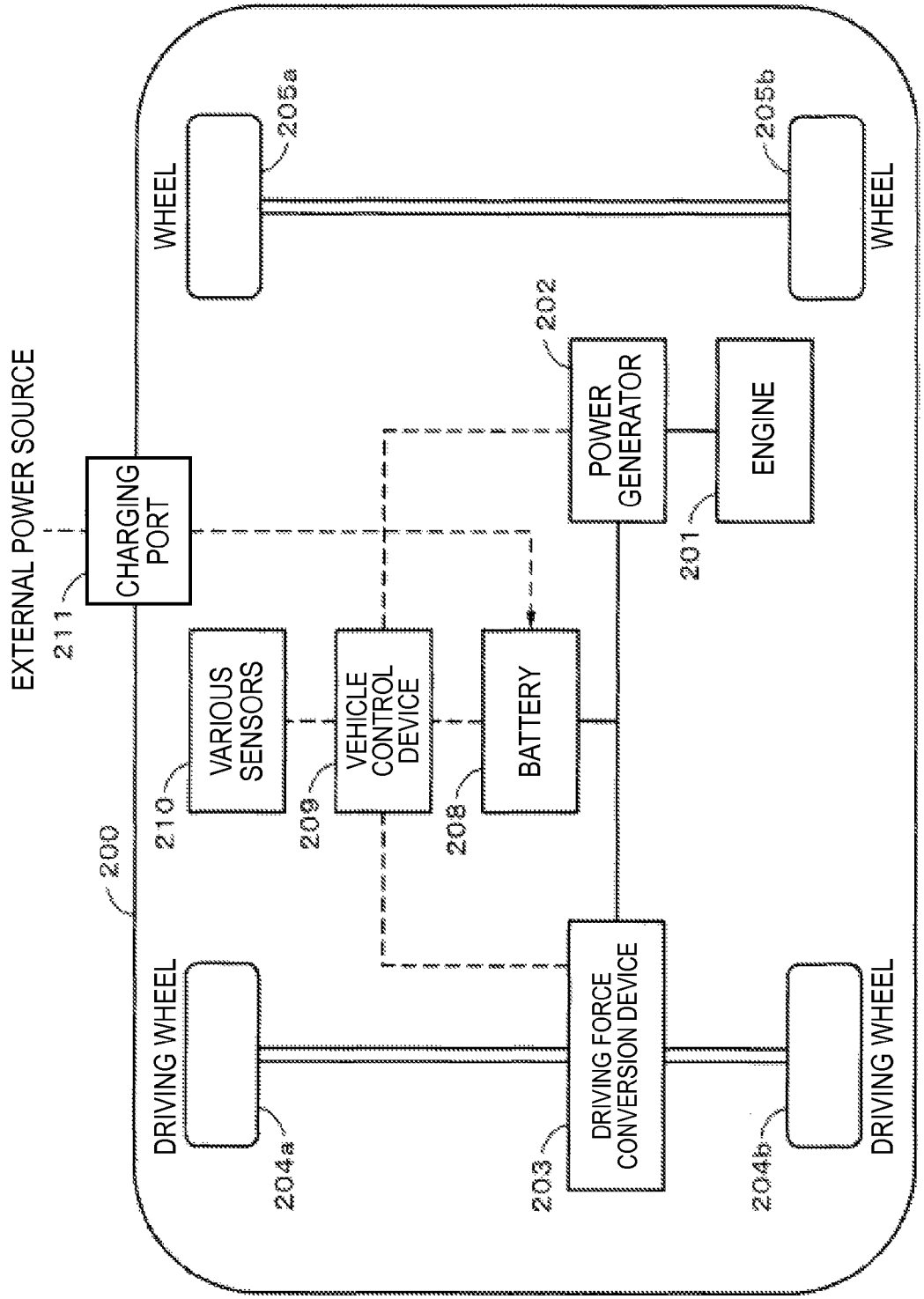
FIG. 9 is a block diagram for explaining an application example of the electric storage device.

An example in which the present disclosure is applied to the electric storage system for vehicles will be described with reference to FIG. 9. FIG. 9 schematically illustrates an example of a configuration of a hybrid vehicle adopting a series hybrid system to which the present disclosure is applied. The series hybrid system is a car traveling by power driving force conversion device using power generated by a power generator driven by an engine or such power stored temporarily in a battery.

On this hybrid vehicle 200, an engine 201, a power generator 202, a power driving force conversion device 203, a driving wheel 204a, a driving wheel 204b, a wheel 205a, a wheel 205b, a battery 208, a vehicle control device 209, various sensors 210, and a charging port 211 are mounted. The electric storage device of the present disclosure described above is applied to the battery 208.

The hybrid vehicle 200 travels with the power driving force conversion device 203 as a driving source. One example of the power driving force conversion device 203 is a motor. The power driving force conversion device 203 is driven by power of the battery 208, and the rotation force of the power driving force conversion device 203 is transmitted to the driving wheels 204a and 204b. Note that with the use of direct current-alternating current (DC-AC) or inverse conversion (AC-DC conversion) at necessary parts, the power driving force conversion device 203 can be also applied to an AC motor and a DC motor. The various sensors 210 control engine speed through the vehicle control device 209 and controls opening of a throttle valve not illustrated (throttle opening). The various sensors 210 include a speed sensor, an acceleration sensor, an engine speed sensor, etc.

The rotation force of the engine 201 is transmitted to the power generator 202, and power generated by the power generator 202 using the rotation force can be stored in the battery 208.

When the speed of the hybrid vehicle is reduced by a braking mechanism not illustrated, the resistance at the time of reduction of speed is added to the power driving force conversion device 203 as rotation force, and regenerative electric power generated by the power driving force conversion device 203 using the rotation force is stored in the battery 208.

The battery 208 is connected to an external power source of the hybrid vehicle, and thus receives power supply from the external power source with the charging port 211 as an input port and can also store the received power.

Although not illustrated, there may be provided an information processing device performing information processing regarding vehicle control based on information about the secondary batteries. Such an information processing device includes an information processing device performing battery remaining amount display based on information about a battery remaining amount.

The above has described, as an example, the series hybrid car traveling by a motor using power generated by the power generator driven by the engine or such power temporarily stored in the battery. However, the present disclosure can be also applied effectively to a parallel hybrid car having output of both an engine and a motor as a driving source and using three systems of travel only by the engine, travel only by the motor, and travel by the engine and the motor while switching them appropriately. Moreover, the present disclosure can be also applied effectively to a so-called electric vehicle, which travels by drive by only a driving motor without an engine.

<4. Modification Example>

The embodiments of the present application have been described above, while the present application is not limited to the above embodiments, and various modifications can be made based on technical ideas of the present disclosure. For example, although the internal resistance after temperature correction is calculated, the comparison of internal resistance may be not performed when a difference between temperatures of the compared internal resistance is equal to or larger than a given value. Moreover, when it is determined that a battery has been exchanged, the determination result may be stored in a nonvolatile memory to prohibit the subsequent charging.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 1 battery unit
2 voltage measurement unit
3 current measurement unit
4 temperature measurement unit
5 charge and discharge control unit
6 engine starting switch
10 power storage device
14 measurement unit
18 controller
20 charging device
23 controller

The invention claimed is:

1. An electric storage device comprising:
   an electric storage unit that includes at least one electric storage element;
   a measurement unit configured to measure a temporal voltage, a temporal current, and a temporal temperature of the electric storage element;
   a calculation unit configured to calculate an internal resistance of the electric storage element based on the temporal voltage, the temporal current, and the temporal temperature measured by the measurement unit; and
   a determination unit configured to determine whether the electric storage element has been exchanged based on a discontinuity of temporal variation of the internal resistance.

2. The electric storage device according to claim 1, wherein the electric storage unit is used for a vehicle, and the internal resistance is calculated when an engine is started.

3. The electric storage device according to claim 1, wherein the internal resistance is calculated when charging of the electric storage unit is started.

4. The electric storage device according to claim 1, wherein a first internal resistance stored in a memory is compared with a second internal resistance calculated based on measured voltage, current, and temperature, and wherein the discontinuity is detected when the second internal resistance is smaller than the first internal resistance.

5. The electric storage device according to claim 4, wherein the first internal resistance and second internal resistance are of values after temperature correction.

6. The electric storage device according to claim 4, wherein the first internal resistance and second internal resistance are obtained when temperatures are substantially equal.

7. The electric storage device according to claim 1, wherein a plurality of values of the first internal resistance and second internal resistance are converted into representative values, and comparison is performed by using the representative values.

8. A power system including the electric storage device according to claim 1, wherein the electric storage device is configured to be charged by a power generation device that generates power from renewable energy.

9. An electric vehicle including the electric storage device according to claim 1, further comprising:
   a conversion device configured to receive supply of power from the electric storage device and to convert the power into driving power of the vehicle; and
   a control device configured to perform information processing regarding vehicle control based on information about the electric storage device.

10. A power system including the electric storage device according to claim 1, further comprising:
    a power information transmission and reception unit that performs transmission and reception of signals with another device through a network,
    wherein charge and discharge control of the electric storage device is configured to be performed based on information received by the power information transmission and reception unit.

11. A power system including the electric storage device according to claim 1, wherein the power system is configured to receive supply of power from the electric storage device and to supply power to the electric storage device from at least one of a power generation device and a power network.

12. The electric storage device according to claim 1, wherein the discontinuity includes a decreasing direction of the internal resistance.

* * * * *